United States Patent [19]

Chautemps et al.

[11] Patent Number: 4,881,249
[45] Date of Patent: Nov. 14, 1989

[54] CHARGE TRANSFER MATRIX TYPE PHOTODETECTOR WITH INTEGRATED CHARGE-FILTERING DEVICE

[75] Inventors: Jacques Chautemps, St. Egreve; André Vidal, Brignoud, both of France

[73] Assignee: Thomson-CSF, Puteaux, France

[21] Appl. No.: 345,232

[22] Filed: May 1, 1989

[30] Foreign Application Priority Data

May 3, 1988 [FR] France ................................. 88 05904

[51] Int. Cl.$^4$ ...................... G11C 19/28; H01L 29/78; H01L 27/14; H04N 3/14
[52] U.S. Cl. ........................................ 377/60; 357/24; 357/30; 358/213.26
[58] Field of Search ................ 357/24, 30; 377/57–63; 358/213.26

[56] References Cited

U.S. PATENT DOCUMENTS 4,245,164  1/1981  Funahashi ............................ 357/24

FOREIGN PATENT DOCUMENTS 0083376  7/1983  European Pat. Off. .
0163547  12/1985 European Pat. Off. .
0235002  9/1987  European Pat. Off. .
2548497  1/1985  France .

OTHER PUBLICATIONS

Patent Abstracts of Japan, vol. 10, No. 65 (E-388)[2122], Mar. 14, 1986; & JP-A-60 217 661 (Toshiba K.K.) Oct. 31, 1985.

Primary Examiner—Gene M. Munson
Attorney, Agent, or Firm—Oblon, Spivak, McClelland, Maier & Neustadt

[57] ABSTRACT

A matrix photodetector includes, for example, at the bottom of the memory zone, an ancillary zone with a region having an implantation of a type opposite to that of the substrate, parallel to the transfer channels and followed by a region for the passage of the charges, located so as to be an extension of the tranfer channels, and surmounted by an ancillary gate capable of receiving low or high ancillary control signals to apply, to the passage region, low or high ancillary potential levels, which are respectively smaller, in terms of absolute value, than the levels of low or high potentials produced by the other gates, thus enabling a first filtering of the charges to be done before they are transferred into the read-out butter, in removing unwanted charges to an anti-blooming device, notably of the type with insulating zone.

8 Claims, 6 Drawing Sheets

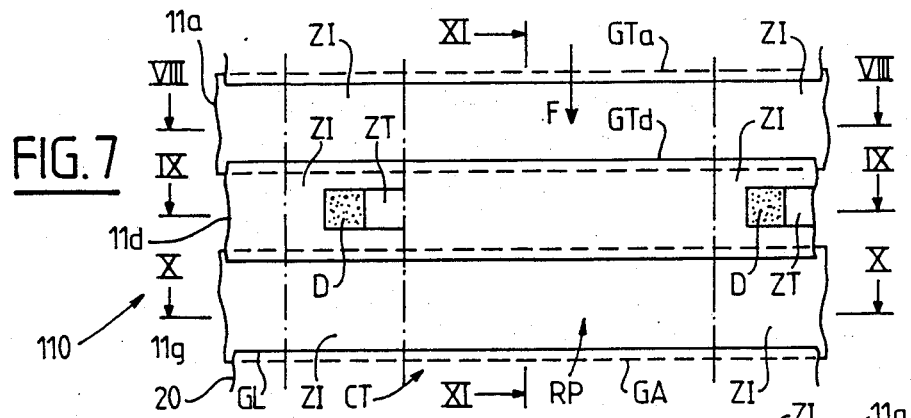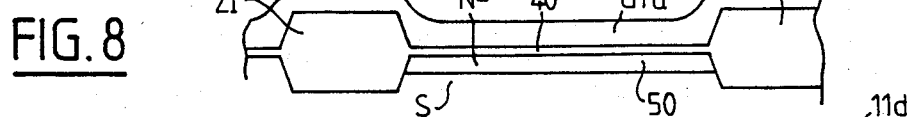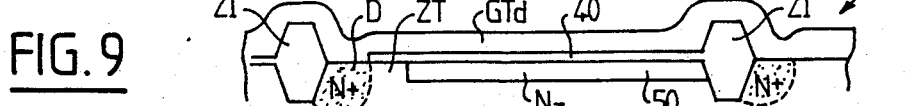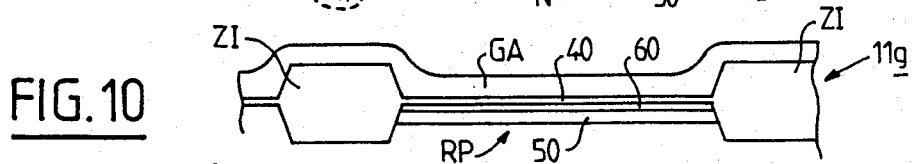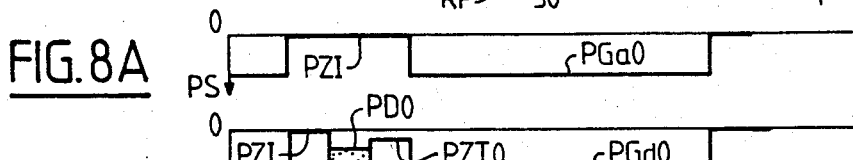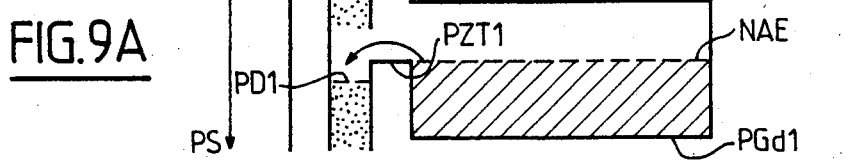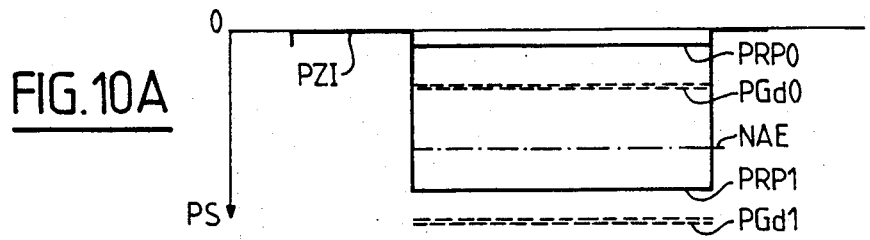

CHARGE TRANSFER MATRIX TYPE PHOTODETECTOR WITH INTEGRATED CHARGE-FILTERING DEVICE

BACKGROUND OF THE INVENTION

1. Field of the Invention

The invention concerns charge transfer matrix photodetectors of the kind having filtering means to give, at output, only those useful or necessary charges that correspond to a useful portion of an incident light radiation.

2. Description of the Prior Art

Photodetectors are used, in principle, to store, transfer and deliver charges at output, according to the incident light radiation to which they are subjected. They do this to restore a digital image. Among photodetectors, we might distinguish those generally having a single row (or line) of photosensitive elements and those (surface or matrix type photodetectors) that are organized either in frame transfer mode, or in inter-line transfer mode, and are formed by sets of parallel charge transfer channels. The invention concerns only matrix photodetectors.

FIG. 1 gives a schematic view of a standard matrix photodetector organized in frame transfer mode. This photodetector 1 has a first zone 1, having a photosensitive sub-zone 10, commonly called an image zone, and a non-photosensitive sub-zone 11, commonly called a memory zone. The photodetector 1 also has a second zone 2, connected to the first zone 1, having a read-out buffer or register 20, extended by a read diode 21, connected to a control transistor 22.

The image zone 10 is a matrix of n lines and p columns. Each column is a vertical charge transfer shift register forming a charge transfer channel. The compartments of the register are photosensitive, and charges collect therein, depending on the illumination of the compartment. The memory zone is formed identically to the image zone, but the compartments of the different registers are not photosensitive. The read-out buffer is a horizontal shift register.

The image zone and the memory zone also have transfer gates which surmount the transfer channels and are capable of receiving low or high control signals to apply a low or high potential level to the transfer channels, so as to enable the transfer of charges therein. The read-out buffer is capable of receiving at least one part of the charges stored in the memory zone, and is surmounted by a read gate capable of also receiving low or high control signals to apply a low or high potential level to the read-out buffer, so as to enable the transfer of the charges, contained in this read-out buffer, into the read diode.

FIG. 2 gives a schematic illustration of a matrix photodetector organized in inter-line transfer mode. The image zone 10' is formed by columns of photodiodes interconnected with columns of photosensitive compartments, belonging to the vertical shift registers forming the memory zone 11'. The low part of each transfer channel CT' is connected to a compartment of a horizontal shift register forming the read-out buffer 20'.

A brief description shall now be given of the working principle of a matrix photodetector organized in frame transfer mode. During an integration period, charges corresponding to the light image received are stored in the registers of the image zone 10. When this integration period has elapsed, the full image stored in the image zone 10 is transferred, during a so-called transfer period, into the memory zone 11. This transfer is done line by line, by a vertical shift. During the next integration period, while the next image is stored in the image zone, the image stored in the memory zone is transferred, line by line, into the read-out buffer by vertical shift, and each line is transferred from the read-out buffer to the read diode by means of a horizontal shift, and then from the read diode to the output.

The working principle of a photodetector organized in inter-line transfer mode is substantially similar. The charges stored in the photodiodes are transferred horizontally towards the shift registers, then each line of the shift registers is shifted vertically into the read-out buffer and transferred to the read diode by a horizontal shift of the latter.

In many cases when pictures are taken, only one part of the image is truly useful or necessary at a given moment. For example, when an object is being tracked, once it has been identified, its tracking needs only low resolution but a high rate of renewal of the image.

FIGS. 3a to 3c give a schematic view of a filtering principle currently used in the prior art to deliver, at output, only useful charges corresponding to said useful portion IMD of the incident light radiation IM, namely that portion of the image which it is desired to display. FIG. 3A shows the desired image IMD. On the n lines of the total image IM, it is desired to eliminate the lines 1 to i as well as the lines j+1 to n so as to display only the lines i+1 to j. In FIG. 3B, the total image IM, including the desired image IMD, is shown as having been already transferred into the memory zone 11. Under the effect of the control signal SCM, which may be low or high, applied to the different transfer gates of the memory zone, each line of this memory zone is transferred into the read-out buffer. This read-out buffer, under the effect of the control signal SCL, which may be low or high, applied to the read gate, transfers the line that it contains into the read diode. This line is then delivered, at output, under the control if the filtering control signal SCF which is actually a control clock signal of the control transistor gate. Thus, when the control signal SCF has a change in state (high/low or reverse) during the action of the control signal SCL, the line present in the read-out buffer is effectively transferred into the read diode and then delivered at output whereas, when the control signal SCF is at the high state, the read diode is reset and no line is delivered. The control transistor 22 and the control signal SCF are therefore part of the filtering means.

A timing diagram of the restitution of the image, present in the memory zone, is shown in FIG. 3C. To explain this timing diagram, the read-out buffer is assumed to have only one line. During the i first pulses of the control signal SCM, the i first lines of the image IM are successively transferred into the read-out buffer 2. This read-out buffer, under the effect of the i first pulses of the control signal SCL, releases these lines. Since the control signal SCF is, during this period, constantly at the high state, none of these lines is actually delivered at output of the photodetector. Hence the unwanted charges, corresponding to the lines 1 to i of the image, have been eliminated. During the pulses i+1 to j of the control signal SCM, these corresponding lines are transferred into the read-out buffer which, under the effect of the corresponding pulses i+1 to j of the control signal SCL, makes the corresponding lines accessible to the outside. Since, during the same period, the control signal SCF has a change in state during the transfer of a line outside the read-out buffer; these lines are effectively delivered at the output of the photodetector, and the lines i+1 to j of the desired image are restored. During the pulses j+1 to n of the control signals SCM and SCL, the control signal SCF is kept at the high state, and the unwanted charges are thus eliminated from the lines j to n. The process is repeated for the following image. It can be seen, at once, that the image-grabbing speed is related to the speed with which the unwanted lines are eliminated by the read-out buffer. At present, to increase this rate, several lines at a time are summed in the read-out buffer. However, this efficiency is limited by the size of the read-out buffer, depending on whether it may contain two or n lines simultaneously. The maximum number of lines that can be contained in a read-out buffer is between four to eight for, beyond this figure, the number becomes too great and there is the risk that the reading frequency might deteriorate. The data rate is thus limited by the size of this read-out buffer, and this has adverse implications for very high data rates.

The present invention overcomes these drawbacks by proposing a matrix photodetector provided with means to filter useful charges that require no oversizing of the read-out buffer and permit a very high image-grabbing rate.

SUMMARY OF THE INVENTION

An object of the invention, therefore, is a charge transfer matrix photodetector of the type comprising:
 a first, partly photosensitive zone, wherein said charges are stored, said first zone having on a semiconducting substrate:
  several parallel charge transfer devices;
  transfer gates, surmounting the transfer channels and being capable of receiving low or high control signals to apply a low or high potential level to the transfer channels, so as to enable the charge transfer therein;
 a second zone, connected to the first zone, capable of receiving at least a portion of the charges stored in the first zone, and comprising:
  a read-out buffer extended by a read diode;
  a read gate, surmounting the read-out buffer, and being capable of receiving low or high control signals to apply a low or high potential level to the read-out buffer, so as to enable the transfer of the charges, contained in the read-out buffer, into the read diode; and,
  filtering means acting on the read diode to deliver, at output, only the useful charges corresponding to a useful portion of the incident light radiation,
wherein the filtering means comprise, in the first zone, an ancillary zone having a region with implantation of a type opposite to that of the substrate, parallel to the transfer channels and followed by a region for the passage of charges, said region being located in the extension of the transfer channels and being surmounted by an ancillary gate capable of receiving high or low ancillary control signals, to apply low or high ancillary levels of potential to the passage region, said ancillary levels of potential being respectively smaller, in terms of absolute value, than the low or high levels of potential produced by the other gates, thus enabling a first filtering of the charges to be performed before their transfer into the read-out buffer.

In a preferred embodiment, the ancillary zone has an anti-blooming device of the insulating zone type, namely of the type described in the French patent application No. 82-11395, filed on behalf of the present applicant.

In a first embodiment, the passage region has a portion with implantation of a type identical to that of the substrate, and the low or high control signals are then respectively identical, in amplitude, to the low or high control signals of the other gates.

In another embodiment, the ancillary low or high control signals have amplitudes different from the respective amplitudes of the other low or high control signals.

According to a variant of the invention, the photodetector is of the frame transfer type, and the ancillary zone is located at the bottom of the image zone.

According to another variant of the invention, the photodetector is of the frame transfer type, and the ancillary zone is located at the end of the memory zone.

The photodetector may also be of the inter-line transfer type, and the ancillary zone is then located at the bottom of the memory zone.

Very advantageously, the photodetector according to the invention may be fitted with at least one other anti-blooming device, of the type with an insulating zone, located in the photosensitive part of the first zones.

BRIEF DESCRIPTION OF THE DRAWINGS

Other advantages and features of the invention will appear from the following detailed description and the appended drawings, of which:

FIG. 7 gives a schematic depiction of the bottom of the memory zone of the photodetector of FIG. 5;

FIG. 8 shows a sectional view, along VIII—VIII of FIG. 7;

FIG. 9 shows a sectional view, along IX—IX of FIG. 7;

FIG. 10 shows a sectional view, along X—X of FIG. 7;

FIG. 8a is a schematic diagram illustrating the variations in the surface potential of the different constituent elements of the photodetector shown in FIG. 8;

FIG. 9A is a schematic diagram illustrating the surface potentials of the different constituent elements of the photodetector shown in FIG. 9;

FIG. 10A is a schematic diagram illustrating the variations of the surface potential of the different constituent elements of the photodetector shown in FIG. 10;

The appended drawings, as well as the French patent application No. 82-11395 and the documents cited therein, could serve not only to give a better understanding of the following detailed description, but also to contribute, if necessary, to the definition of the invention.

DESCRIPTION OF PREFERRED EMBODIMENTS

Figure 4:
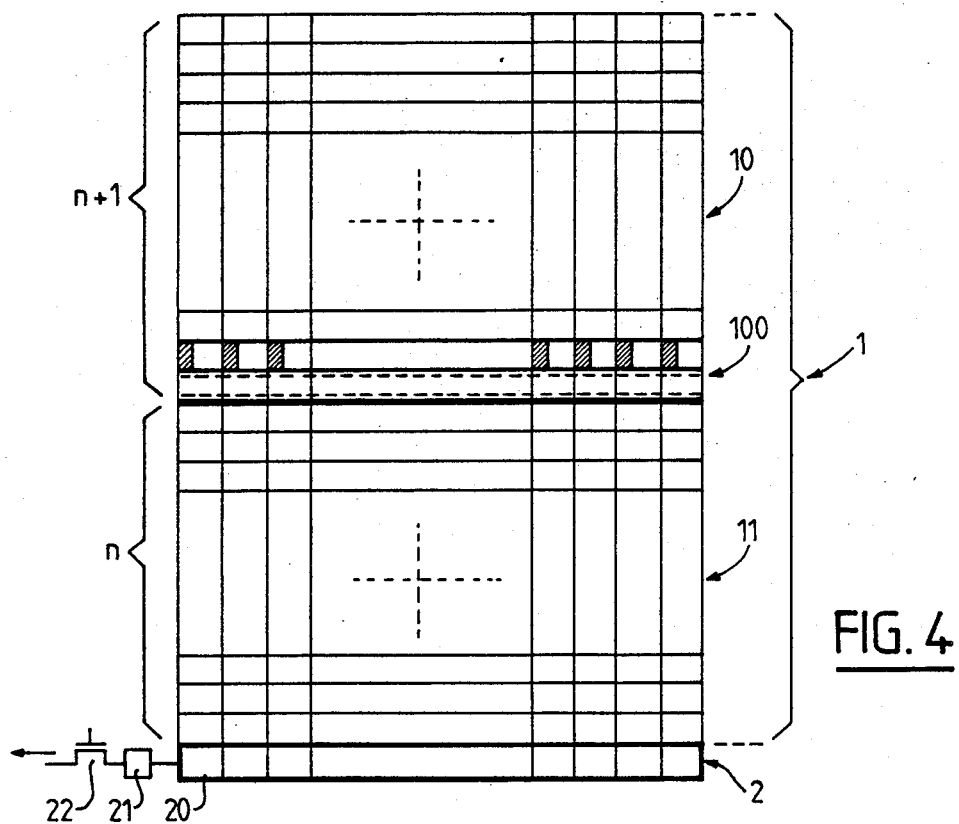
FIG. 4 gives a schematic illustration of a first embodiment of a photodetector according to the invention.

FIG. 4 gives a schematic view of a first embodiment of the photodetector according to the invention. In this first embodiment, the photodetector is of the frame transfer matrix type, and it is seen that the image zone 10 has m+1 lines, i.e. one line more than in a standard prior art photodetector. Furthermore, the nth line of the image zone, namely, the last but one line, has regions with implantation of a type opposite to that of the substrate, parallel to the transfer channels. These implanted regions, as well as the additional line n+1, form part of an ancillary zone 100 which shall be described in detail below and which is, thus, located at the bottom of the image zone.

Figure 5:
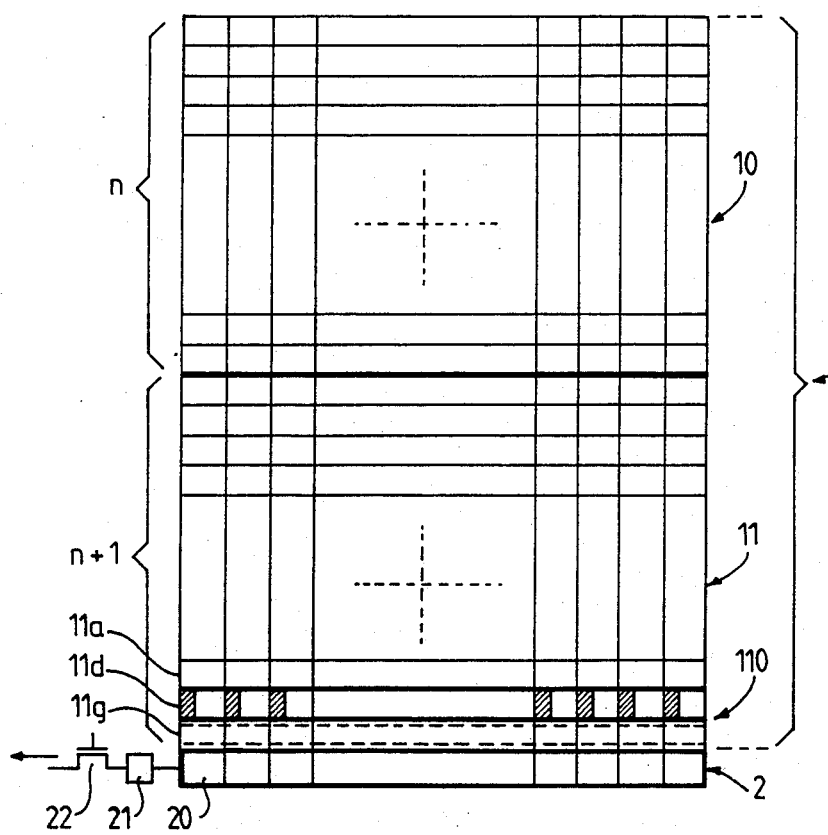
FIG. 5 gives a schematic illustration of a second embodiment of a photodetector according to the invention.

FIG. 5 gives a schematic view of a second embodiment of the frame transfer matrix photodetector. In this figure, the memory zone 11 has n+1 lines, namely one line more than in a prior art photodetector. The ancillary zone 110 is similar to the ancillary zone 100 and is located on the lines n and n+1 of the memory zone 11, respectively referenced 11d and 11g, i.e. at the bottom of the memory zone.

Figure 6:
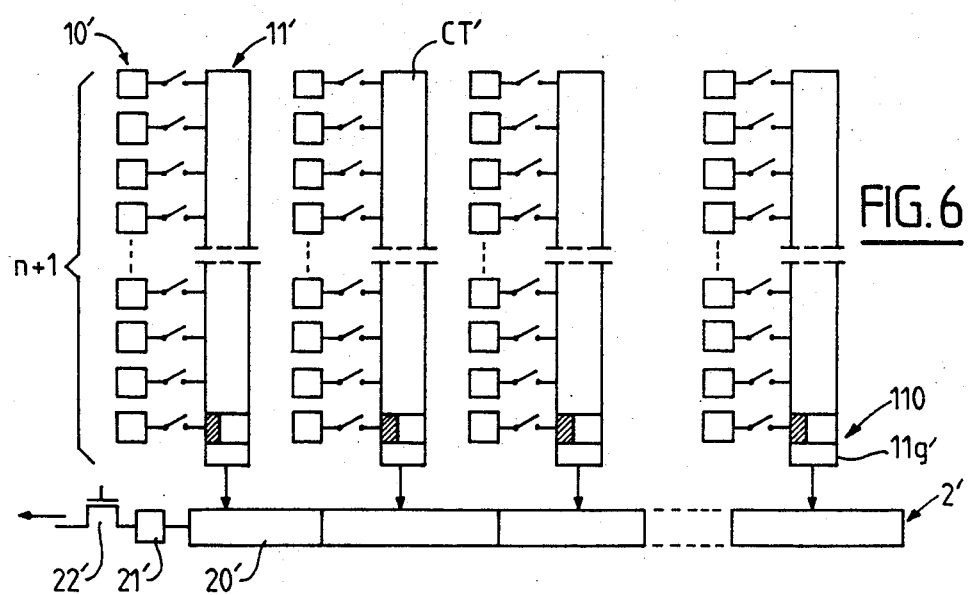
FIG. 6 gives a schematic illustration of a third embodiment of a photodetector according to the invention.

FIG. 6 gives a schematic view of a third embodiment of a photodetector according to the invention, where this photodetector is of the inter-line transfer type. In this case, the transfer channels CT' of the memory zone 11' have n+1 compartments and an ancillary zone 110' is defined. This ancillary zone 110' is analogous to the ancillary zones 100 and 110, at the bottom of the memory zone.

Referring now to FIGS. 7 to 10, we shall give a detailed description of the structure of an ancillary zone 110, located at the bottom of the memory zone 11 in the case of a frame-transfer matrix photodetector. Thus, FIGS. 7 to 10 give a more precise view of the lines n−1, n and n+1 of the memory zone 11, these lines being respectively referenced 11a, 11d and 11g.

The charge transfer photodetector has a semiconductor substrate S such as one made of P type silicon for example, at least partly covered with an insulating layer 40 made, for example, of silicon oxide. FIG. 7 shows a transfer channel CT in which the charges can be transferred longitudinally in the direction of the arrow F. Each line of the matrix photodetector has transfer gates such as GTa and GTd, covering the transfer channel CT and positioned in a direction which is substantially perpendicular to the direction in which the charges are transferred. The set (gate/insulator layer/substrate) defines charge-coupling type capacitors in the transfer channel CT.

That portion of the transfer channel which is located on the line 11d has an anti-blooming device of the type described in the French patent application No. 82-11395. This anti-blooming device shall hereinafter be called an "insulating zone type of antiblooming device". The main constituent elements as well a the main operating principles of this device shall be recalled below, and those skilled in the art may refer to the above mentioned French patent application No. 82-11395 for more details.

In an example where the transfer of charges is done in the mass, the transfer channel CT has an implantation of purities 50, of a type opposite to that of the substrate. This implantation 50 occupies the entire width of this channel CT. The insulating zone type of anti-blooming device is located between two adjacent transfer channels. This device has a diode D, formed by a region with an implantation of a type opposite to that of the substrate, namely of the N type, parallel to the transfer channel CT. This device also has a transition zone ZT, providing for a reduction in the surface potential of the substrate. The surface potential of this transition zone ZT varies as a function of the potential applied to the gate GTd. The diode D and the transfer zone ZT are surrounded on all sides, except on the side contiguous to the transfer channel CT, by an insulating zone ZI, such that the surface potential in the substrate, beneath this insulating zone, is null and invariable as a function of the voltages applied to the gates GTd as well as to the adjacent gates. By way of an example, this insulating zone ZI may be made by an implantation of impurities of the same type as that of the substrate, with a concentration of impurities higher than $10^{19}$ atoms/cm$^3$, or else by a deposit of insulator such as silicon oxide in a thickness of approximately 1 micron. This insulating zone ZI is extended by the line 11a, so as to be contiguous with that portion of the transfer channel CT which is covered with the gate GTa.

The additional line 11g includes a transfer channel portion having, between the diffusion of impurities 50 and the insulating zone 40, a diffusion of impurities 60 of a type opposite to that of the diffusion of impurities 50, hence of the same type as that of the substrate, i.e. of the P type. This transfer channel portion forms a passage region RP for charges going through from the memory zone 11 towards the read-out buffer 20. This transfer region RP therefore extends the channel CT in the memory zone 11. The line 11g also includes the extension of the insulating zone ZI parallel to the passage region RP. Thus, the ancillary zone 110 has the insulating zone type of anti-blooming device including the diode D, the transition zone ZT and the insulating zone ZI, as well as the passage region RP covered with an ancillary gate GA of the same type as the transfer gates GTa and GTd. This ancillary gate GA is controlled independently of the other transfer gates and the read gate GL.

FIGS. 8A to 10A give a schematic illustration of the development of the surface potentials PS of the different regions of the substrate. In a general manner, each gate is controlled by a low or high control signal, which gives the zone located beneath the gate a low or high potential level. The reference of the potential level of a zone will be assigned the suffix 0 for a low potential level and the suffix 1 for a high potential level. Thus, the low potential level of that portion of the transfer channel zone which is located beneath the transfer gate GTa will be assigned the reference PGa0.

FIGS. 8A, 9A and 10A show that the surface potential PZI, in the insulating zone ZI, is null and invariable as a function of the potentials applied to the different gates. The first part of FIG. 9A shows the development of the surface potential PS when the transfer gate GTb is actuated by the low control signal, and the second part of this very same FIG. 9A shows the development of the surface potentials when the transfer gate GTd is actuated by the control signal 0. In the latter case, when there is an accumulation of charges, and when the anti-blooming level NAE is exceeded, there is a discharge of excess charges towards the potential wells formed by the diode D. It must be noted that the high potential level PZT1 of the transfer zone should be greater than the low potential level PGd0, so that the excess charges go preferably towards the diode D instead of overflowing, in the direction of the transfer, towards the other potential wells.

FIG. 10A illustrates the development of the surface potential beneath the ancillary gate GA, which is subjected to a high or low ancillary control signal. In a first variant of the invention, the ancillary control signals of the ancillary gate GA are identical in amplitude to the control signals of the transfer and read gates, but the compensation caused by the diffusion of the impurities zone 60 causes a potential level PRP, in the passage zone RP, which is different from the potential levels in the rest of the transfer channel. Thus, when the ancillary gate is actuated by the ancillary control signal at the low state, the surface potential PRP0 of the passage region is lower than the potential PGd0, and when the ancillary gate is actuated by the ancillary control signal at the high state, the high potential level PRP1 of the passage region is smaller than the potential levels PGd1 but greater than the anti-blooming level NAE.

Figure 11:
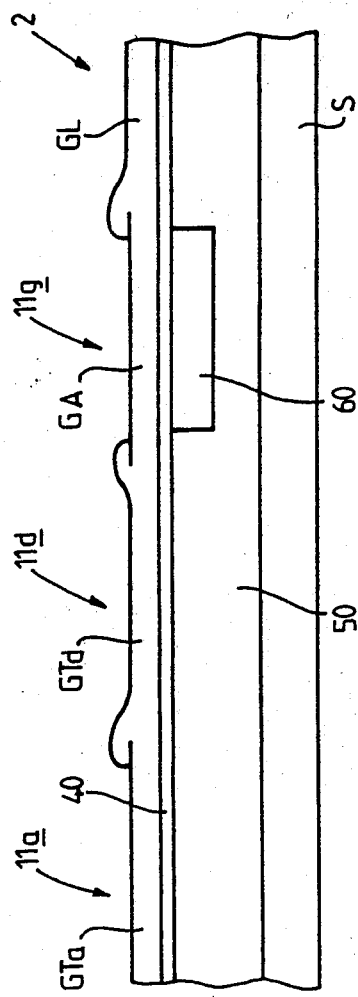
FIG. 11 shows a sectional view, along XI—XI of FIG. 7.

FIG. 11 gives a schematic view, in longitudinal section, of the lines 11a, 11d and 11g, as well as of the read-out buffer 20. This section shows the implantation of impurities 60, of the same type as the substrate.

Figure 11A:
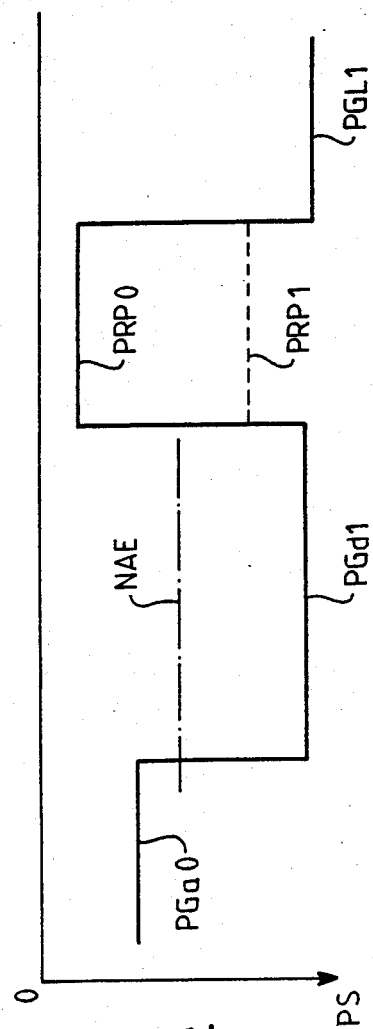
FIG. 11A is a schematic diagram illustrating the variations in the surface potential of the different constituent elements of the photodetector shown in FIG. 11 and, FIG. 12 is a schematic timing diagram illustrating the working principle of a photodetector according to the invention.

FIG. 11A shows the development of the surface potential corresponding to the section of FIG. 11, in a particular example of operation. It is assumed, in this example, that the transfer gate GTa is actuated by the control signal at the low state, that the transfer gate GTd is actuated by the control signal at the high state, as is the case for the read gate GL, while the ancillary gate is actuated by the ancillary control signal at the low state.

This figure therefore again shows the positioning of the different potential levels with respect to one another.

In another variant according to the invention, the ancillary signals of the ancillary gate GA may differ, in amplitude, from the control signals of the other gates, so as to apply, to the ancillary gate, a voltage which is lower than that of the other gates, so as to keep to the scale of the potential levels.

Figure 1:
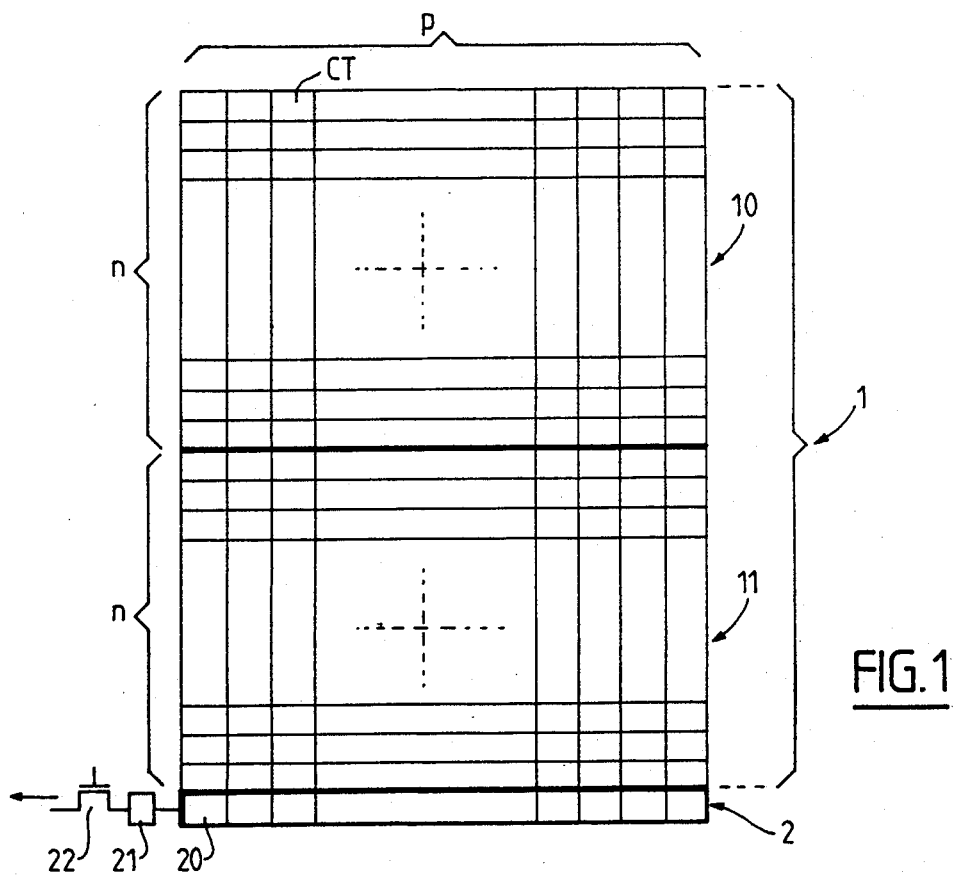
FIG. 1, already described, illustrates the prior art, and is a schematic depiction of a standard frame transfer matrix photodetector.
Figure 2:
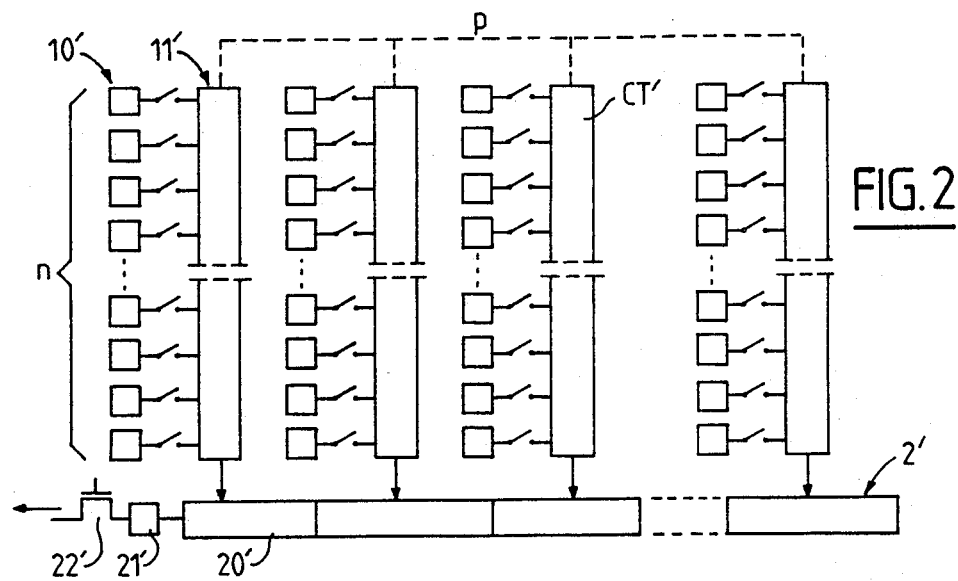
FIG. 2, already described, illustrates the prior art, and is a schematic depiction of a standard inter-line transfer photodetector.
Figure 3A:
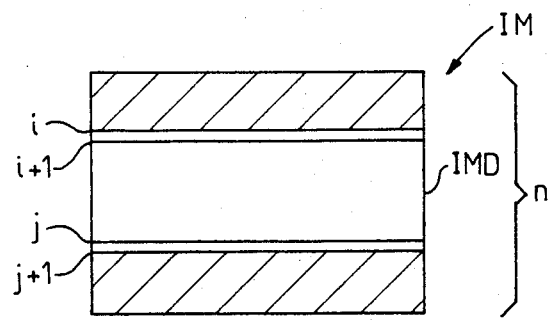
FIGS. 3a to 3c, already described, give a schematic illustration of the working principle of a prior art frame transfer matrix photodetector of the type including filtering means to deliver, at output, only useful charges corresponding to a useful portion of the incident light radiation.
Figure 3B:
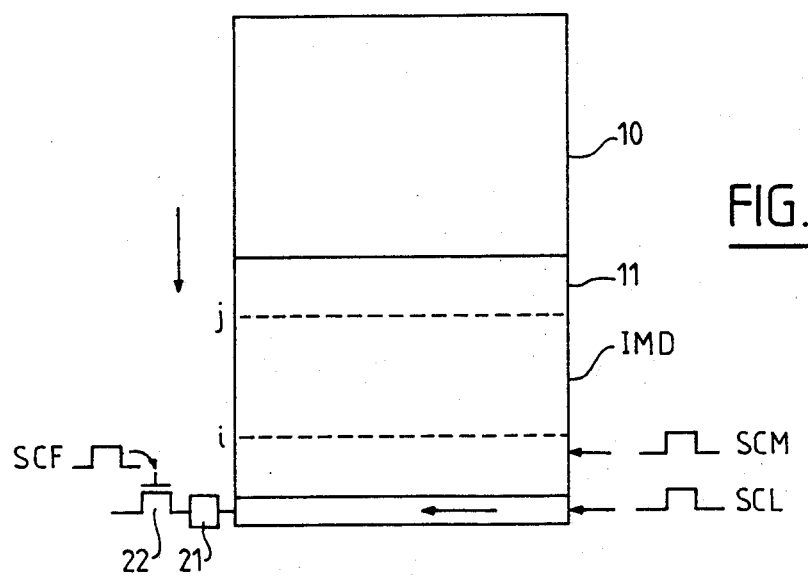
Figure 3C:
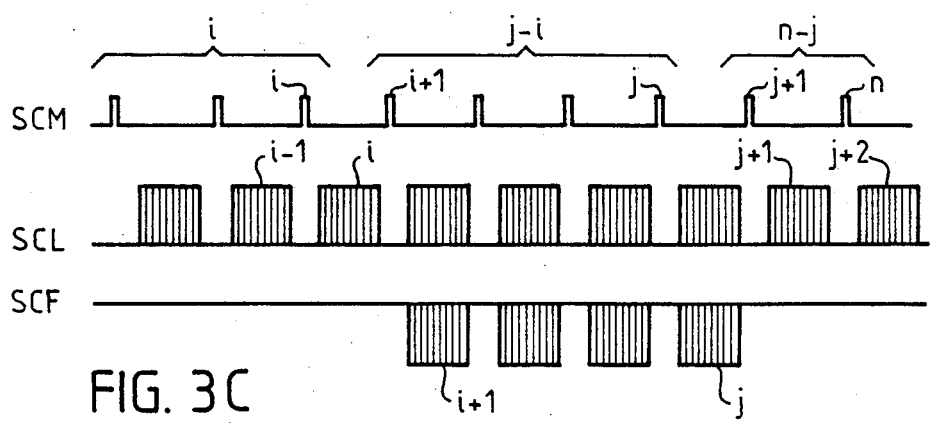
Figure 12:
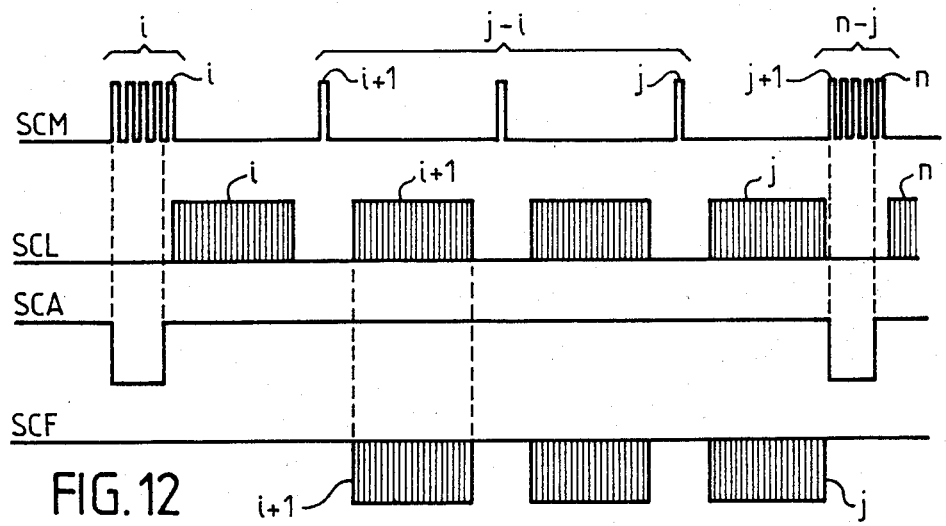

FIGS. 11A and 12 will now be used to illustrate the working principle of the photodetector according to the invention.

In FIG. 12, the reference SCM designates the control signal applied to the different transfer gates of the memory zone, the reference SCL designates the control signal applied to the read gate GL, the reference SCA designates the ancillary control signal applied to the ancillary gate, while the reference SCF designates the filtering control signal applied to the control transistor 22.

It is still sought to obtain a digital image IMD, formed by the lines i+1 to j, at the output of the photodetector. Hence, during the i first pulses of the control signal SCM, the ancillary control signal SCA is low, applying a low potential level PRP0 to the passage region RP. The charges corresponding to the lines 1 to i−1 then get collected against the potential barrier formed beneath the gate GA and, when the level of these charges exceeds the anti-blooming level NAE, the excess charges, hence the unwanted charges, are eliminated by the insulating zone type to anti-blooming device. During the pulse i of the signal SCM, the control signal SCA is high as is the control signal of the read gate SCL. This is also true for the pulses i+1 to j. The unwanted charges, corresponding to the line i, are then transferred into the read-out buffer, and then into the read diode, and are removed by means of the high control signal SCF. The other charges corresponding to the lines i+1 to j, which are therefore useful charges, are effectively delivered at output to restitute the desired image IMP. An arrangement identical to that used for the pulses i is used for the pulses j+1 to n, the pulses j+1 to n−1 being removed by the insulating zone type of anti-blooming device, while the pulse n is removed by means of the filtering control signal SCF.

Those skilled in the art will therefore understand that it is the combination of the insulating zone type of anti-blooming device and the additional line 11g, provided with the ancillary gate GA, that enables a first filtering of the useful charges before they are transferred into the read-out buffer. Thus, the latter does not have to be oversized since, at the most, it removes only one unwanted line. Furthermore, the number of summations of unwanted lines is unlimited, and the smaller the number of lines, the smaller becomes the period of recurrence between two images.

A description has been given, above, of an ancillary zone located at the bottom of the memory zone, for this arrangement is more worthwhile than an arrangement where an ancillary zone is placed at the end of the image zone, because it is possible to act directly on the information that will come out, whereas an arrangement at the end of the image zone enables action only on the information which will come out one image period later.

Clearly, an ancillary zone 110', placed at the bottom of the memory zone in the case of an inter-line transfer matrix photodetector, would work identically.

Although the use, in the ancillary zone, of an insulating zone type of anti-blooming device is particularly advantageous, it is not necessary to use an anti-blooming device of this type. It would be enough, simply, for the ancillary zone to include, in addition to the passage region surmounted by the ancillary gate, a region with implantation of the type opposite to that of the substrate, such as is used, for example, in the prior art anti-blooming devices described in the French patent application No. 82-11395. A method of fabrication of a photodetector of this type, according to the invention, is described in detail in the French patent application No. 82-11395.

The invention may have variants, notably the following ones:

the invention has been described in using a P type silicon substrate, but it is clear to those skilled in the art that it is not restricted to this type of substrate or to the type of impurities used. However, in the case of an N type substrate, the signs of the charges and of the potentials will be reversed with respect to the above described P type substrate, and the transfer zone ZT will then provide for an increase in the surface potential while the ancillary potential levels (low or high) of the passage region will be respectively smaller, in terms of absolute value, than the potential levels (low or high) produced by the other gates;

a photodetector according to the invention, may have, in the image zone, at least one other insulating zone type of anti-blooming device, and this other device will then fulfill its own function as described in the French patent application No. 82-11395.

Clearly, some of the means described below may be omitted in variants where they are of no use.

What is claimed is:

1. A charge transfer matrix photodetector of the type comprising:
    a first, partly photosensitive zone, wherein said charges are stored, said first zone having, on a semiconducting substrate:
        a plurality of parallel charge transfer devices;
        transfer gates, surmounting the transfer channels and being capable of receiving low or high control signals to apply a low or high potential level to the transfer channels, so as to enable the transfer of charges therein;
    a second zone, connected to the first zone, capable of receiving at least a portion of the charges stored in the first zone, and comprising:
        a read-out buffer extended by a read diode;
        a read gate, surmounting the read-out buffer, and being capable of receiving low or high control signals to apply a low or high potential level to the read-out buffer, so as to enable the transfer of the charges, contained in the read-out buffer, into the read diode; and,
        filtering means acting on the read diode to deliver, at output, only useful charges corresponding to a useful portion of the incident light radiation,
    wherein the filtering means comprise, in the first zone, an ancillary zone having a region with implantation of a type opposite to that of the substrate, parallel to the transfer channels and followed by a region for the passage of charges, said region being located in the extension of the transfer channels and being surmounted by an ancillary gate capable of receiving high or low ancillary control signals, to apply low or high ancillary levels of potential to the passage region, said ancillary levels of potential being respectively smaller, in terms of absolute value, than the low or high levels of potential produced by the other gates, thus enabling a first filtering of the charges to be performed before their transfer into the read-out buffer.

2. A device according to claim 1, wherein the ancillary zone has an antiblooming device of the type with insulating zone.

3. A device according to claim 1, wherein the passage region has a portion with implantation of a type identical to that of the substrate, and wherein the low or high ancillary control signals are respectively identical, in amplitude, to the low or high control signals of the other gates.

4. A device according to claim 1, wherein the ancillary low or high control signals have amplitudes different from the respective amplitudes of the other low or high control signals.

5. A device according to claim 1, wherein it is of the frame transfer type, the first zone including a first photosensitive sub-zone, called an image zone, followed by a second non-photosensitive sub-zone, called a memory zone, and wherein said ancillary zone is located at the bottom of the image zone.

6. A device according to the claim 1, wherein it is of the frame transfer type, the first zone including a first photosensitive sub-zone, called an image zone, followed by a second non-photosensitive sub-zone, called a memory zone, and wherein said ancillary zone is located at the bottom of the memory zone.

7. A device according to claim 1, wherein it is of the inter-line transfer type, including a first sub-zone, formed by photosensitive elements, particularly photodiodes, and a second sub-zone called a memory zone, comprising columns of charge transfer channels, and wherein said ancillary zone is located at the bottom of the memory zone.

8. A device according to any of the above claims, comprising at least one other anti-blooming device of the type with insulating zone, located in the photosensitive part of the first zone.

* * * * *